United States Patent
Hatakeyama et al.

(10) Patent No.: US 12,482,670 B2
(45) Date of Patent: Nov. 25, 2025

(54) METHOD FOR MANUFACTURING SEMICONDUCTOR DEVICE AND SEMICONDUCTOR DEVICE

(71) Applicant: Resonac Corporation, Tokyo (JP)

(72) Inventors: Keiichi Hatakeyama, Tokyo (JP); Masaaki Takekoshi, Tokyo (JP); Goki Toshima, Tokyo (JP)

(*) Notice: Subject to any disclaimer, the term of this patent is extended or adjusted under 35 U.S.C. 154(b) by 0 days.

(21) Appl. No.: 18/861,583

(22) PCT Filed: May 29, 2024

(86) PCT No.: PCT/JP2024/019750
§ 371 (c)(1),
(2) Date: Oct. 30, 2024

(87) PCT Pub. No.: WO2024/248051
PCT Pub. Date: Dec. 5, 2024

(65) Prior Publication Data
US 2025/0226238 A1    Jul. 10, 2025

(30) Foreign Application Priority Data

May 30, 2023   (WO) .................. PCT/JP2023/020084

(51) Int. Cl.
*H01L 21/56* (2006.01)
*H01L 21/78* (2006.01)

(52) U.S. Cl.
CPC .......... *H01L 21/561* (2013.01); *H01L 21/568* (2013.01); *H01L 21/78* (2013.01)

(58) Field of Classification Search
CPC ...... H01L 21/561; H01L 21/568; H01L 21/78
See application file for complete search history.

(56) References Cited

U.S. PATENT DOCUMENTS

2011/0217826 A1* 9/2011 Sakurada ............ H01L 21/304
                                                                438/464
2012/0175761 A1* 7/2012 Zenbutsu ............ H01L 23/293
                                                                257/676
(Continued)

FOREIGN PATENT DOCUMENTS

JP    H6-021219       1/1994
JP    2005-322815    11/2005
(Continued)

OTHER PUBLICATIONS

International Search Report dated Aug. 8, 2023 for PCT/JP2023/020084 and its English translation.
(Continued)

*Primary Examiner* — Peniel M Gumedzoe
(74) *Attorney, Agent, or Firm* — SOEI PATENT & LAW FIRM

(57) ABSTRACT

As an example, a method for mounting a bridge die 20 on a support such as a redistribution layer in a state where a connection terminal of the bridge die 20 faces upward (face-up) is disclosed. In this method, before forming an adhesive layer on a back surface of the bridge die, a resin layer 23 is formed so as to cover terminal electrodes 22 on a semiconductor substrate 21 of the bridge die 20 with a thermosetting resin film (e.g. DAF). Each bridge die 20 is mounted on the support such as a wiring layer 12 by vacuum-suctioning an entire surface of the cured resin layer 23 with a collet. According to this method, it is possible to prevent the bride die from bending as compared with a method of suctioning only at the outer edge avoiding the terminal electrode.

19 Claims, 9 Drawing Sheets

(56) References Cited

U.S. PATENT DOCUMENTS

| | | | |
|---|---|---|---|
| 2016/0075871 A1* | 3/2016 | Morita | H01L 24/94 525/481 |
| 2016/0211228 A1 | 7/2016 | Morita et al. | |
| 2021/0020574 A1 | 1/2021 | Yu et al. | |
| 2021/0098421 A1 | 4/2021 | Wu et al. | |
| 2022/0093526 A1 | 3/2022 | Wu et al. | |

FOREIGN PATENT DOCUMENTS

| | | |
|---|---|---|
| JP | 2009-212300 | 9/2009 |
| JP | 2015-214660 | 12/2015 |
| KR | 10-2016-0108196 | 9/2016 |
| KR | 10-2022-0152208 | 11/2022 |
| WO | 2018/147097 | 8/2018 |

OTHER PUBLICATIONS

International Search Report dated Aug. 6, 2024 for PCT/JP2024/019750 and its English translation.

* cited by examiner (a)

(b)

(c)

(d)

(a)

(b)

(a)

(b)

(a)

(b)

(c)

(a)

(b)

(a)

(b)

(c)

(d)

(e)

METHOD FOR MANUFACTURING SEMICONDUCTOR DEVICE AND SEMICONDUCTOR DEVICE

CROSS-REFERENCE TO RELATED APPLICATIONS

This application is a 35 U.S.C. § 371 national phase application of PCT Application No. PCT/JP2024/019750, filed on May 29, 2024, which claims the benefit of priority from PCT Patent Application No. PCT/JP2023/020084, filed on May 30, 2023.

TECHNICAL FIELD

The present disclosure relates to a method for manufacturing a semiconductor device and a semiconductor device.

BACKGROUND ART

In recent years, with rapid enhancement of functions of electronic devices represented by AI/HPC and the like, semiconductor packages have been rapidly increased in size and density. Not only a packaging structure thereof becomes to have denser surface mounting, but the packaging structure and a packaging process are also becoming more complicated and diversified, with an inorganic (silicon) or organic interposer (Bridge die/RDL) technology, 2.xD mounting using the same, and a 3D mounting (HBM/Chiplet) technology utilizing TSV. For example, with "Packaging Solution Center" as a main base, RESONAC CORPORATION is conducting technological development of a next generation semiconductor packaging process from the perspective of customers (semiconductor manufacturers) by combining a mounting process and materials.

As a technology in such a semiconductor packaging field, Patent Literature 1 discloses a method for manufacturing a semiconductor device in which a semiconductor die is mounted face-up on a carrier to encapsulate the semiconductor die, a wiring layer is formed on an encapsulating layer, and another semiconductor die is mounted on the wiring layer. Patent Literature 2 discloses another method for manufacturing a semiconductor device.

CITATION LIST

Patent Literature

Patent Literature 1: US 2021/0098421 A
Patent Literature 2: US 2022/0093526 A

SUMMARY OF INVENTION

Technical Problem

In the manufacturing method described in Patent Literature 1, in order to mount the semiconductor die on a support, it is conceivable to mount the semiconductor die on the support by suctioning and picking up a terminal electrode side of the semiconductor die with a collet. In this case, as illustrated in FIG. 9 (*a*), an outer periphery of a semiconductor die 120 is suctioned by a collet C1 so as to avoid an internal region where terminal electrodes 122 (copper pillars or the like) are provided. However, thinning of the semiconductor die progresses, and the semiconductor die may be bent by performing such suction. In particular, in a case where a plurality of semiconductor dies are obtained by dividing a semiconductor wafer, the semiconductor die is pushed up with a pin or the like from the back side when being separated from the dicing tape, and this may induce warping of the semiconductor die, or may cause the semiconductor die to be cracked in some cases. As illustrated in FIG. 9 (*b*), when the semiconductor die 120 is mounted on the support after suction and then pressed, a load is applied only to an outer peripheral portion of the semiconductor die 120 from the collet C1, and therefore, the load is hardly applied to a central portion of the back surface of the die, which can result in insufficient bonding or the formation of voids in the central portion.

An object of the present disclosure is to provide a method for manufacturing a semiconductor device capable of reliably attaching a semiconductor member (semiconductor die).

Solution to Problem

[1] The present disclosure relates to, as one aspect, a method for manufacturing a semiconductor device. This method for manufacturing a semiconductor device includes, preparing a semiconductor member including a semiconductor substrate having a first surface and a second surface on an opposite side, a plurality of terminal electrodes provided on the first surface of the semiconductor substrate, and a cured resin layer provided on the first surface so as to cover the plurality of terminal electrodes; picking up the semiconductor member by suctioning a surface of the cured resin layer of the semiconductor member with a holding member; and attaching the semiconductor member to a support.

In this method for manufacturing a semiconductor device, a cured resin layer is provided on the first surface of the semiconductor device so as to cover the plurality of terminal electrodes. The surface of the cured resin layer is suctioned and picked up to perform the subsequent attachment. In this case, the plurality of terminal electrodes are covered with the resin layer, and the semiconductor member is suctioned and picked up by the holding member without avoiding the terminal electrodes, so that it is possible to prevent the semiconductor member (semiconductor die) from being warped or broken. In addition, since the plurality of terminal electrodes are covered with the resin layer, when the semiconductor member is attached to the support, a load is applied to the entire semiconductor member in a planar direction, and the semiconductor member can be reliably attached to the support. As described above, according to this method for manufacturing a semiconductor device, it is possible to reliably attach the semiconductor member. Further, in this method for manufacturing a semiconductor device, since a portion covering the terminal electrodes is formed of the cured resin layer, the manufacturing is easy. The "cured resin layer" referred to here only needs to be cured to such an extent that at least one of suction and application of a load can be performed, and includes a case where the resin layer is not completely cured (so-called C stage).

[2] In the method for manufacturing a semiconductor device according to [1], the preparing the semiconductor member may include forming a resin layer containing a curable resin composition on the first surface of the semiconductor substrate so as to cover the plurality of terminal electrodes, and curing the resin layer to obtain the cured resin layer. In this case, the resin layer for protecting the plurality of terminal electrodes can be easily formed.

[3] In the method for manufacturing a semiconductor device according to [1] or [2], the cured resin layer is preferably formed by bonding a resin film containing a curable resin composition to the first surface of the semiconductor substrate and then curing the resin film. In this case, the resin layer for protecting the plurality of terminal electrodes can be easily formed.

[4] In the method for manufacturing a semiconductor device according to [1] or [2], the cured resin layer may be formed by applying a liquid adhesive containing a curable resin composition to the first surface of the semiconductor substrate and then curing the liquid adhesive. In this case, the resin layer for protecting the plurality of terminal electrodes can be easily formed.

[5] In the method for manufacturing a semiconductor device according to any one of [1] to [4], the cured resin layer preferably contains an inorganic filler. In this case, the hardness (such as elastic modulus) of the resin layer can be improved, and warping and cracking of the semiconductor member can be further prevented. In addition, when the inorganic filler is contained, warpage of the semiconductor member including the resin layer can be prevented.

[6] In the method for manufacturing a semiconductor device according to [5], in which a content of the inorganic filler in the cured resin layer may be 30 mass % or more based on a total solid content contained in the resin layer before curing. In this case, the warpage of the semiconductor member can be more reliably prevented.

[7] In the method for manufacturing a semiconductor device according to [5] or [6], an average particle diameter of the inorganic filler in the cured resin layer is preferably 20 μm or less. In this case, even in a case where each terminal electrode of the semiconductor member and a pitch thereof are miniaturized, a resin and a filler can be made to enter (fill) between the respective terminal electrodes, and the terminal electrodes can be reliably covered with the resin layer. In addition, warping of the cured resin layer can be prevented.

[8] In the method for manufacturing a semiconductor device according to any one of [1] to [7], an elastic modulus of the cured resin layer at room temperature may be 10 MPa or more. In this case, warping and cracking of the semiconductor member can be further prevented. In addition, in a case where the cured resin layer is polished to expose the terminal electrodes, a polishing operation can be easily performed. The elastic modulus referred to here means Young's modulus. The room temperature means 25° C. When the cured resin layer has a high elastic modulus, a resin layer, a copper pattern, and the like can be easily ground at the time of grinding in the subsequent steps. As described above, regarding the cured resin layer, a case where the resin layer is not completely cured is also included, and it is sufficient that the resin layer is hard to such an extent that the resin layer can be polished in the polishing operation.

[9] In the method for manufacturing a semiconductor device according to any one of [1] to [8], the preparing the semiconductor member preferably includes preparing a semiconductor wafer including the semiconductor substrate, in which a plurality of electrodes including the plurality of terminal electrodes are provided on the first surface of the semiconductor wafer; forming a wafer resin layer containing a curable resin composition on the first surface of the semiconductor wafer so as to cover the plurality of electrodes; curing the wafer resin layer; and acquiring the semiconductor member by singulating the semiconductor wafer by dicing. In this case, a plurality of semiconductor members can be collectively manufactured. Further, according to this manufacturing method, even in a case of singulated by dicing, the semiconductor member can be separated from a dicing tape without being warped or broken.

[10] The method for manufacturing a semiconductor device according to any one of [1] to [9], may further include forming an encapsulant layer on the support by encapsulating the semiconductor member with an encapsulant after attaching the semiconductor member to the support.

[11] In the method for manufacturing a semiconductor device according to [10], an average particle diameter of the inorganic filler contained in the encapsulant layer is preferably larger than an average particle diameter of the inorganic filler contained in the cured resin layer. When the inorganic filler having a large size is contained in the encapsulant, warpage of the encapsulant layer due to heat can be reliably prevented. In particular, in a large wafer process, suction can be reliably performed in high-precision processing in the next and subsequent steps.

[12] In the method for manufacturing a semiconductor device according to [10] or [11], a difference between a linear expansion coefficient of the encapsulant layer and a linear expansion coefficient of the cured resin layer is preferably 150 ppm/K or less. In this case, the behavior of the encapsulant layer and the resin layer when heat is applied to the manufactured semiconductor device becomes uniform, and it is possible to reduce occurrence of defects due to heat such as deviation in expansion.

[13] The method for manufacturing a semiconductor device according to any one of [10] to [12], may further include polishing the cured resin layer together with the encapsulant layer so that a tip of each of the plurality of terminal electrodes is exposed from the cured resin layer. In this case, a fine wiring layer or the like can be accurately formed on the surface of the polished encapsulant layer or the like.

[14] In the method for manufacturing a semiconductor device according to any one of [1] to [13], a thickness of the cured resin layer may be 15 μm or more or 30 μm or more in at least one of the picking up and the attaching. In this case, warping and cracking of the semiconductor member can be more reliably prevented.

[15] In the method for manufacturing a semiconductor device according to any one of [1] to [14], an adhesive member configured to attach the semiconductor member to the support may be provided on the second surface of the semiconductor substrate. In this case, the semiconductor member can be more reliably attached to the support. In addition, it is easy to attach the semiconductor member to the support.

[16] In the method for manufacturing a semiconductor device according to [15], the adhesive member may be provided on the second surface of the semiconductor substrate before the attaching the semiconductor member to the support. In this case, the work of attaching the semiconductor member to the support is simplified.

[17] In the method for manufacturing a semiconductor device according to [15] or [16], a difference between a linear expansion coefficient of the cured resin layer and a linear expansion coefficient of the adhesive member may be 150 ppm/K or less. In this case, since the thermal expansions of the cured resin layer and the adhesive member which sandwich the semiconductor substrate therebetween are substantially the same, it is possible to prevent a position or parallelism of the semiconductor substrate from being impaired and to prevent the warpage of the chip to be mounted.

[18] In the method for manufacturing a semiconductor device according to any one of [15] to [17], the adhesive member is preferably the same member as the resin layer before being cured. In this case, since the members arranged on the upper and lower sides of the semiconductor substrate are the same type, even in a case where heat or the like is applied, the same behavior is obtained, and it is possible to reduce defects due to a difference in behavior.

[19] In the method for manufacturing a semiconductor device according to any one of [1] to [18], a thickness of the cured resin layer may be between 50% and 150% with respect to a height of the plurality of terminal electrodes. In this case, since the thickness of the resin layer is substantially equal to the height of the terminal electrode, the semiconductor member can be picked up and attached more reliably. The height of the plurality of terminal electrodes referred to here means an average height of the heights of the plurality of terminal electrodes.

[20] In the method for manufacturing a semiconductor device according to any one of [1] to [19], in the picking up, the semiconductor member is preferably picked up by the holding member suctioning the entire surface of the cured resin layer, and in the attaching, the semiconductor member is preferably attached by the holding member applying a load to the entire surface of the cured resin layer. In this case, warping or cracking of the semiconductor member can be more reliably prevented, and the semiconductor member can also be more reliably attached to the support.

[21] In the method for manufacturing a semiconductor device according to any one of [1] to [20], an ionic impurity concentration of the cured resin layer is preferably 5 ppm or less. In this case, migration between the plurality of terminal electrodes covered with the cured resin layer can be prevented.

[22] In the method for manufacturing a semiconductor device according to any one of [1] to [21], the adhesive strength between the cured resin layer and the first surface of the semiconductor substrate may be 1 MPa or more. In this case, in a manufactured semiconductor device, the resin layer of the semiconductor member is prevented from being separated.

[23] In the method for manufacturing a semiconductor device according to any one of [1] to [22], the adhesive strength between the cured resin layer and the first surface of the semiconductor substrate is preferably 3 MPa or more. In this case, in a manufactured semiconductor device, the resin layer of the semiconductor member is more reliably prevented from being separated.

[24] The method for manufacturing a semiconductor device according to any one of [1] to [23], may further include mounting a first semiconductor die and a second semiconductor die on a side of the first surface of the semiconductor member after attaching the semiconductor member to the support. In the mounting, the first semiconductor die and the second semiconductor die may be connected to each other by the semiconductor member. In this case, the semiconductor die can function as a bridge die.

[25] The present disclosure relates to, as another aspect, a semiconductor device. The semiconductor device includes a semiconductor member and a support to which the semiconductor member is attached. The semiconductor member includes a semiconductor substrate having a first surface and a second surface on an opposite side, a plurality of terminal electrodes provided on the first surface of the semiconductor substrate, and a cured resin layer provided on the first surface so as to cover the plurality of terminal electrodes.

[26] The semiconductor device according to [25], may further include an adhesive member configured to attach the semiconductor member to the support. A difference between a linear expansion coefficient of the cured resin layer and a linear expansion coefficient of the cured adhesive member is preferably 150 ppm/K or less. In this case, since the thermal expansions of the cured resin layer and the cured adhesive member which sandwich the semiconductor substrate therebetween are substantially the same, it is possible to prevent a position or parallelism of the semiconductor substrate from being impaired and to prevent the warpage of the chip to be mounted, in the semiconductor device.

[27] The semiconductor device according to [25] or [26], may further include an encapsulant layer configured to encapsulate the semiconductor member.

[28] In the semiconductor device according to [27], an average particle diameter of an inorganic filler contained in the encapsulant layer may be larger than an average particle diameter of an inorganic filler contained in the cured resin layer. When the inorganic filler having a large size is contained in the encapsulant layer, warpage of the encapsulant layer due to heat can be reliably prevented.

[29] In the semiconductor device according to [27] or [28], a difference between a linear expansion coefficient of the encapsulant layer and a linear expansion coefficient of the cured resin layer may be 150 ppm/K or less. In this case, the behavior of the encapsulant layer and the resin layer when heat is applied to the semiconductor device becomes uniform, and it is possible to reduce occurrence of defects due to heat such as deviation in expansion.

[30] The semiconductor device according to any one of [25] to [29], may further include a first semiconductor die and a second semiconductor die provided on a side of the first surface of the semiconductor substrate. The plurality of terminal electrodes of the semiconductor member may be connected to the first semiconductor die and the second semiconductor die.

Advantageous Effects of Invention

According to the present disclosure, it is possible to provide a method for manufacturing a semiconductor device capable of reliably attaching a semiconductor member.

DESCRIPTION OF EMBODIMENTS

Figure 1:
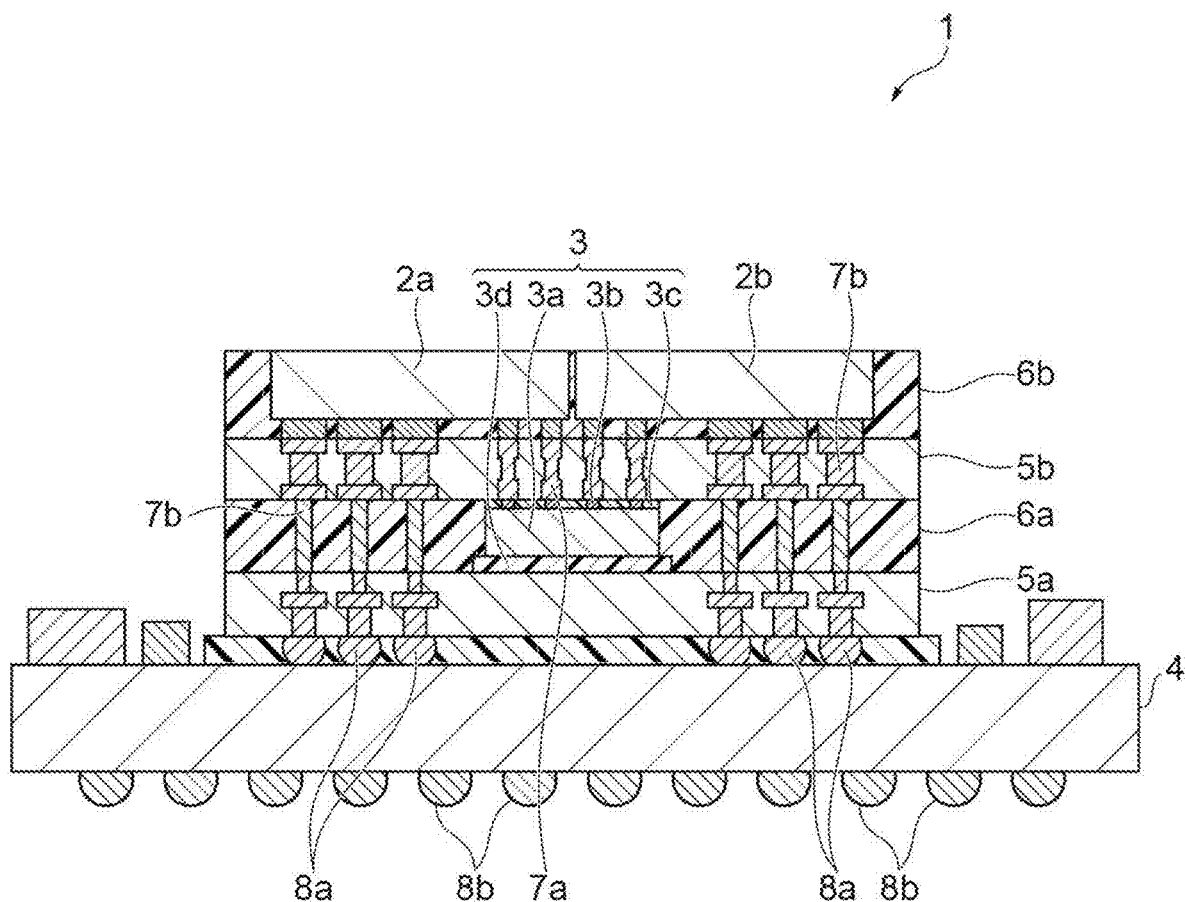
FIG. 1 is a cross-sectional view illustrating an example of a cross-sectional configuration of a semiconductor device according to an embodiment of the present invention.

Hereinafter, an embodiment according to the present invention will be described in detail with reference to the drawings. In the following description, the same or corresponding portions are denoted by the same reference numerals, and redundant description is omitted. Unless otherwise specified, the positional relationship such as up, down, left, and right is based on the positional relationship illustrated in the drawings. The dimensional ratios in the drawings are not limited to the illustrated ratios.

In the present specification, the term "layer" includes a structure having a shape partially formed in addition to a structure having a shape formed on the entire surface when observed as a plan view. In the present specification, the term "step" includes not only an independent step but also a step that cannot be clearly distinguished from other steps as long as an intended action of the step is achieved.

In the present specification, a numerical range indicated using "to" indicates a range including numerical values described before and after "to" as a minimum value and a maximum value, respectively. In a numerical range described in stages in the present specification, an upper limit value or a lower limit value of the numerical range of a certain stage may be replaced with an upper limit value or a lower limit value of the numerical range of another stage. In the numerical range described in the present specification, an upper limit value or a lower limit value of the numerical range may be replaced with a value shown in Examples.

FIG. 1 is a view illustrating an example of a semiconductor device manufactured by a manufacturing method according to an embodiment of the present invention. As illustrated in FIG. 1, a semiconductor device 1 includes semiconductor dies 2*a* and 2*b*, a semiconductor die 3, a substrate 4, wiring layers 5*a* and 5*b*, encapsulant layers 6*a* and 6*b*, connection electrodes 7*a* and 7*b*, and bumps 8*a* and 8*b*. The semiconductor dies 2*a* and 2*b* (a first semiconductor die and a second semiconductor die) are, for example, semiconductor chips such as an LSI chip, a CMOS sensor, and a memory. The semiconductor die 3 is, for example, a bridge die or a silicon capacitor, and connects the semiconductor die 2*a* and the semiconductor die 2*b* to each other via the connection electrode 7*a*. In the semiconductor device 1, the wiring layer 5*a* including a part (a lower part) of the connection electrode 7*b*, the encapsulant layer 6*a* encapsulating the semiconductor die 3, the wiring layer 5*b* including a part (an upper part) of the connection electrode 7*b* and the connection electrode 7*a*, and the encapsulant layer 6*b* encapsulating the semiconductor dies 2*a* and 2*b* are sequentially stacked on the substrate 4. The connection electrodes 7*b* are connected to the substrate 4 via a plurality of bumps 8*a*. The substrate 4 is further provided with a plurality of other bumps 8*b* for connection to an external device.

In the semiconductor device 1, the semiconductor die 3 is provided in the encapsulant layer 6*a* in a face-up state. The semiconductor die 3 includes a semiconductor substrate 3*a*, a plurality of terminal electrodes 3*b* provided on an upper surface (a first surface) of the semiconductor substrate 3*a*, a resin layer 3*c* formed on the upper surface of the semiconductor substrate 3*a* so as to cover the plurality of terminal electrodes 3*b*, and an adhesive member 3*d* provided on a lower surface (a second surface) of the semiconductor substrate 3*a*. The resin layer 3*c* is a resin layer obtained by thermosetting either of a resin film containing a thermosetting adhesive such as a die attach film (DAF) or a liquid thermosetting adhesive. That is, a material constituting the resin layer 3*c* is in a semi-cured (B-stage) state and then in a completely cured (C-stage) state by the subsequent curing treatment. However, the resin layer 3*c* may be in a cured state not reaching a completely cured state as long as there is no problem as the semiconductor device 1. A curable resin composition constituting the resin layer 3*c* contains a thermosetting resin, and may contain, for example, at least one selected from the group consisting of an epoxy resin, a bismaleimide resin, a triazine resin, and a phenol resin. The curable resin composition may further contain a curing agent, a curing accelerator, and inorganic fillers. Tips of the plurality of terminal electrodes 3*b* are exposed on a surface of the resin layer 3*c*. The plurality of terminal electrodes 3*b* are connected to the semiconductor dies 2*a* and 2*b* via the connection electrodes 7*a*. For example, the semiconductor die 3 which is a bridge die is an extremely thin semiconductor die, and for example, may have a thickness of 100 μm or less and a thickness of 50 μm or less. The terminal electrodes 3*b* of the semiconductor die 3 and a pitch thereof are also miniaturized, a diameter of the terminal electrode 3*b* is, for example, 10 μm to 50 μm, the terminal pitch (a separation distance) between the terminal electrodes 3*b* is, for example, 5 μm to 20 μm, and the height of the terminal electrode 3*b* is, for example, 20 μm to 50 μm. However, the size of the terminal electrode 3*b* is not limited thereto. The adhesive member 3*d* is a member that bonds and fixes the semiconductor die 3 to the wiring layer 5*a* or the like, and may be formed of, for example, the same material (for example, DAF or the like) as the resin layer 3*c*. The adhesive member 3*d* may be formed of a material having a linear expansion coefficient equivalent to the linear expansion coefficient of the material (cured product) constituting the resin layer 3*c*. For example, a difference between the linear expansion coefficient of the cured resin layer 3*c* and the linear expansion coefficient of the cured adhesive member 3*d* is preferably 150 ppm/K or less. Also, the adhesive member 3*d* may have a thickness equivalent to the thickness of the resin layer 3*c*, may be thicker, or may be thinner. Similarly, the difference between the linear expansion coefficient of the encapsulant layer 6*a* and the linear expansion coefficient of the cured resin layer 3*c* may be 150 ppm/K or less. The encapsulant layer 6*a* may contain inorganic fillers, and an average particle diameter of the inorganic fillers contained in the encapsulant layer 6*a* may be larger than an average particle diameter of the inorganic fillers contained in the cured resin layer 3*c*.

Figure 2:
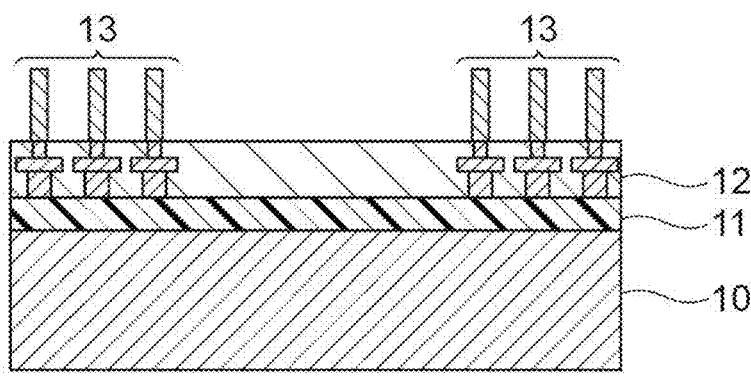
FIG. 2 (a) to (d) is a cross-sectional view illustrating a method for manufacturing the semiconductor device illustrated in FIG. 1.
Figure 2:
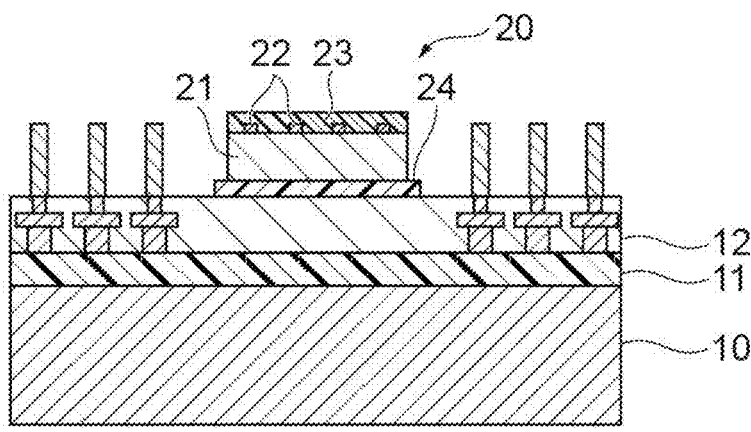
Figure 2:
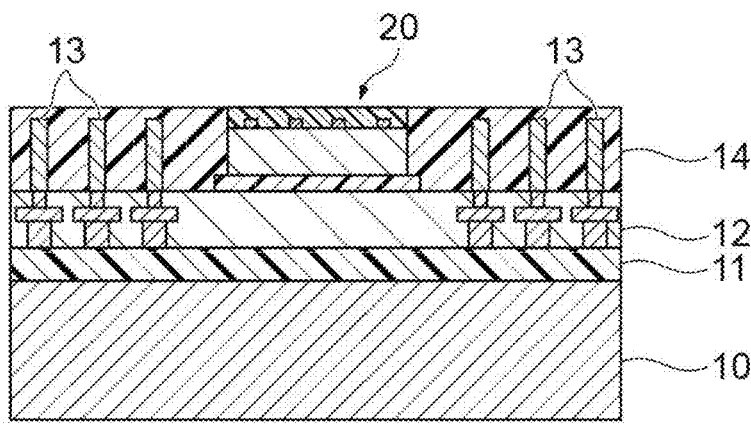
Figure 2:
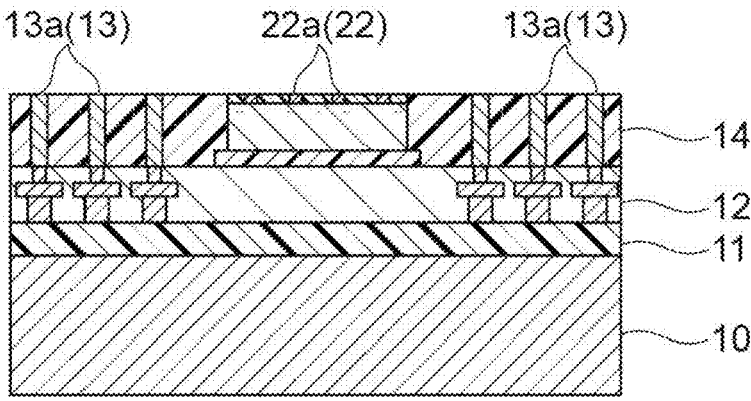

Next, an example of a method for manufacturing the semiconductor device 1 will be described with reference to FIG. 2 to FIG. 5. FIG. 2 to FIG. 5 are cross-sectional views sequentially illustrating the method for manufacturing the semiconductor device 1. In the method for manufacturing the semiconductor device, as illustrated in FIG. 2 (*a*), first, a temporary fixing layer 11 is formed on a carrier substrate 10. The carrier substrate 10 is, for example, a glass substrate. The temporary fixing layer 11 is, for example, a curable adhesive layer, and is configured to be separated together with the carrier substrate 10 by light, heat, or the like in a step described later. After the temporary fixing layer 11 is formed, a wiring layer 12 is formed on the temporary fixing layer 11. The wiring layer 12 includes a plurality of connection electrodes 13 and an insulating portion. The wiring layer 12 is, for example, a redistribution layer (RDL). Each of the connection electrodes 13 is formed of, for example, a copper pillar, and is formed such that an upper half thereof protrudes from a surface of the insulating portion. The connection electrodes 13 are electrodes connected to semiconductor dies 25 and 26 described later (see a FIG. 3 (b)), and are formed on an outer side or an outer peripheral side in a planar direction of the wiring layer 12. In the method for manufacturing the semiconductor device illustrated in FIG. 1, the connection electrode 13 is not formed on an inner side or the central portion in the planar direction of the wiring layer 12, but may be formed.

Subsequently, as illustrated in FIG. 2 (b) and FIG. 6, a semiconductor die 20 (a semiconductor member) is prepared. The semiconductor die 20 includes a semiconductor substrate 21, a plurality of terminal electrodes 22, a resin layer 23 (a cured resin layer), and an adhesive member 24. The semiconductor substrate 21 includes an upper surface 21a (a first surface) and a lower surface 21b (a second surface) on an opposite side. The plurality of terminal electrodes 22 are, for example, copper pillars provided on the upper surface 21a of the semiconductor substrate 21, and are connected to wiring (not illustrated) in the semiconductor substrate 21. A diameter of each terminal electrode 22 is, for example, 10 μm to 50 μm, a terminal pitch (a separation distance) between the terminal electrodes 3b is, for example, 5 μm to 20 μm, and the height of the terminal electrode 3b is, for example, 20 μm to 50 μm. However, the size of the terminal electrode 22 is not limited thereto. The adhesive member 24 is a member for attaching and fixing the semiconductor die 20 to a support such as the wiring layer 12, and is formed of, for example, a film member containing a thermosetting adhesive such as a die attach film (DAF). In this stage, the adhesive member 24 is not cured, and is thermally cured in a step described later.

In the semiconductor die 20, the resin layer 23 is provided on the upper surface 21a of the semiconductor substrate 21 so as to cover the plurality of terminal electrodes 22. Such a resin layer 23 can be formed, for example, by bonding a resin film formed of a thermosetting adhesive (a curable resin composition) to the upper surface 21a of the semiconductor substrate 21 and then thermally curing the resin film. In this case, a DAF similar to the adhesive member 24 can be used. The resin layer 23 may be formed so as to cover the entire terminal electrodes 22, or may be formed so that the tips of the terminal electrodes 22 are exposed from the surface of the resin layer 23. The resin layer 23 may be formed by applying a liquid adhesive containing a thermosetting adhesive (a curable resin composition) similar to the resin film to the upper surface 21a of the semiconductor substrate 21 and then curing the liquid adhesive. It is sufficient that the resin layer 23 is cured to such an extent that at least one of suctioning and applying a load, and further, polishing described later can be performed, and a case where the resin layer is not completely cured (so-called C stage) is also included. However, the resin layer may be completely cured. The thickness of the resin layer 23 may be, for example, 50 μm or less, 20 μm or less, 10 μm or less, 9 μm or less, 8 μm or less, or 7 μm or less, and may be 1 μm or more, 2 μm or more, 3 μm or more, 4 μm or more, 5 μm or more, or 10 μm or more. The thickness of the resin layer 23 may be between 50% and 150% or between 80% and 120% with respect to the height of the plurality of terminal electrodes 22, and is preferably the same thickness as the height of the terminal electrodes 22. The thickness of the resin layer 23 referred to here means the thickness after curing, and the height of the plurality of terminal electrodes 22 means an average of the heights of the plurality of terminal electrodes 22. The thickness of the resin layer 23 may be between 50% and 150% or between 80% and 120% with respect to the height of the plurality of terminal electrodes 22 even after the resin layer 23 is polished in a step described later. In this case, the thickness of the resin layer 23 before polishing may be larger than the thickness of the adhesive member 24.

The thermosetting adhesive constituting the film contains, for example, a high molecular weight resin component and a thermosetting component. The high molecular weight resin component may contain, for example, at least one resin selected from the group consisting of acrylic rubber, polyimide, and phenoxy resin. The high molecular weight resin component may have a reactive group such as an epoxy group. A weight average molecular weight (a value in terms of standard polystyrene by GPC method) of the high molecular weight resin component may be 100,000 to 3 million. The content of the high molecular weight resin component may be 30 to 80 parts by mass with respect to 10 parts by mass of the total mass of the resin layer 23.

The thermosetting component that can be contained in the resin layer 23 is a compound having a reactive group that forms a crosslinked structure by self-polymerization and/or reaction with a curing agent. The thermosetting component may contain, for example, at least one selected from the group consisting of an epoxy resin, a bismaleimide resin, a triazine resin, and a phenol resin. The content of the thermosetting component may be 1 to 30 parts by mass with respect to 100 parts by mass of the amount of the resin layer 23. The thermosetting adhesive constituting the resin layer 23 may contain other components as necessary. Examples of other components include a curing agent that reacts with the thermosetting component, a curing accelerator that accelerates the reaction between the thermosetting component and the curing agent, a coupling agent (for example, a silane coupling agent), and fillers (for example, silica).

The resin layer 23 may contain inorganic fillers. Specific examples of the inorganic fillers include glass, silica, alumina, titanium oxide, carbon black, mica, and boron nitride, and among them, silica, alumina, titanium oxide, and boron nitride are preferable from the viewpoint of handleability and processability (versatility), and silica, alumina, and boron nitride are more preferable from the viewpoint of dispersibility in a resin and easy particle size controllability. These may be used singly or in combination of two or more kinds thereof. The average particle diameter of the inorganic fillers contained in the resin layer 23 may be, for example, 20 μm or less, or 10 μm or less, and the maximum particle diameter of the inorganic fillers may be, for example, 30 μm or less. It is preferable that an average particle diameter of the inorganic fillers be 5 μm or less, and a maximum particle diameter of the inorganic fillers be 20 μm or less. When the average particle diameter is 10 μm or less and the maximum particle diameter is 30 μm or less, a space between the terminals can be filled without a gap when the resin layer is formed on a terminal surface, and warpage of the resin layer after curing can be prevented. A lower limit of the average particle diameter and a lower limit of the maximum particle diameter of the inorganic fillers are not particularly limited, and both may be 0.001 μm or more.

Examples of a method for measuring the average particle diameter and the maximum particle diameter of the inorganic fillers include a method for measuring a particle diameter of about 20 inorganic fillers using a scanning electron microscope (SEM). Examples of the measurement method using the SEM include a method in which a sample in which a resin composition containing inorganic fillers is heat-cured (preferably at 150 to 180° C. for 1 to 10 hours) is prepared, a central portion of the sample is cut, and a cross-section thereof is observed with an SEM. In this case, an existence probability of the fillers having a particle diameter of 3 µm or less in the cross section is preferably 80% or more of all fillers.

A content of the inorganic fillers in the resin layer 23 may be 10 mass % to 95 mass % based on a total solid content contained in the resin layer 23 before curing. The content of the inorganic fillers contained in the resin layer 23 is preferably 20 mass % or more, more preferably 30 mass % or more, particularly preferably 40 mass % or more, and preferably 40 mass % to 95 mass %, based on the total solid content contained in the resin layer 23 (adhesive) before curing. The elastic modulus (Young's modulus) of such a resin layer 23 may be, for example, 10 MPa or more or 1.0 GPa or more at room temperature (25° C.). Also, the linear expansion coefficient of the resin layer 23 at a temperature equal to or lower than a glass transition temperature may be, for example, 10 ppm/K to 200 ppm/K. The adhesive member 24 may have the same configuration as that of the resin layer 23 or may contain the inorganic fillers as described above. In this case, an elastic modulus of the adhesive member 24 at room temperature may be 10 MPa or more, and the linear expansion coefficient thereof may be, for example, 10 ppm/K to 200 ppm/K. The difference between the linear expansion coefficient of the resin layer 23 and the linear expansion coefficient of the adhesive member 24 is preferably 150 ppm/K or less. The difference between the linear expansion coefficient of the resin layer 23 and the linear expansion coefficient of the adhesive member 24 may be 150 ppm/K or less even after the adhesive member 24 is cured (that is, after obtaining the semiconductor device 1).

In a material forming the resin layer 23, it is preferable that a concentration of ionic impurities contained is reduced. Specifically, an ionic impurity concentration of the cured resin layer 23 is, for example, 5 ppm or less, may be 3 ppm or less, preferably 1 ppm or less, more preferably 0.5 ppm or less, and still more preferably 0.3 ppm or less. This prevents migration between the plurality of terminal electrodes 22 covered by the resin layer 23, and the resin layer 23 can ensure insulation between the terminal electrodes 22. Since the resin layer 23 remains as a constituent element of the semiconductor device 1 to be manufactured (since it is not separated during manufacturing), it is preferable to have such a migration prevention function. Examples of the ionic impurity referred to here include sodium (Na), potassium (K), and chlorine (Cl).

Since the resin layer 23 remains as a constituent element of the semiconductor device 1 to be manufactured, it is preferable that the resin layer is reliably fixed to the upper surface 21a of the semiconductor substrate 21 in a cured state. Specifically, the adhesive strength between the cured resin layer 23 and the upper surface 21a of the semiconductor substrate 21 is 1 MPa or more, and preferably 3 MPa or more.

Figure 6:
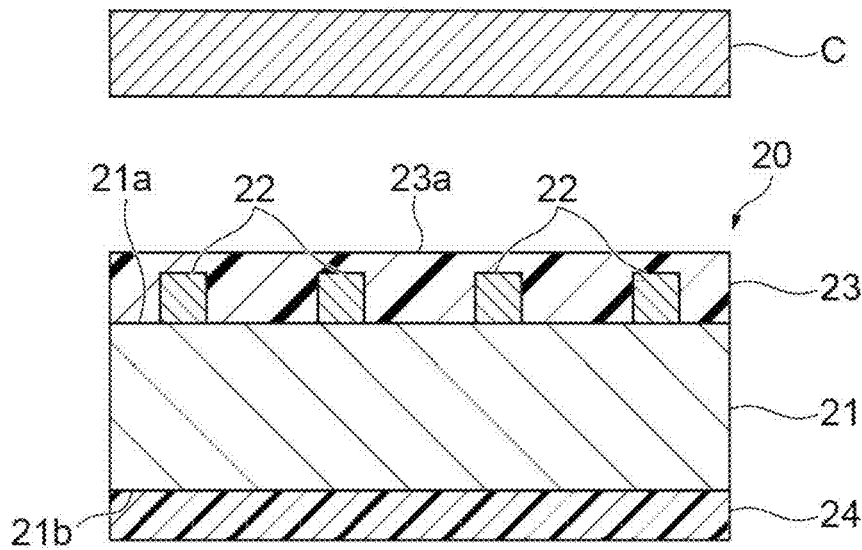
FIG. 6 (a) and (b) is a view for explaining a step of picking up a bridge die.
Figure 6:
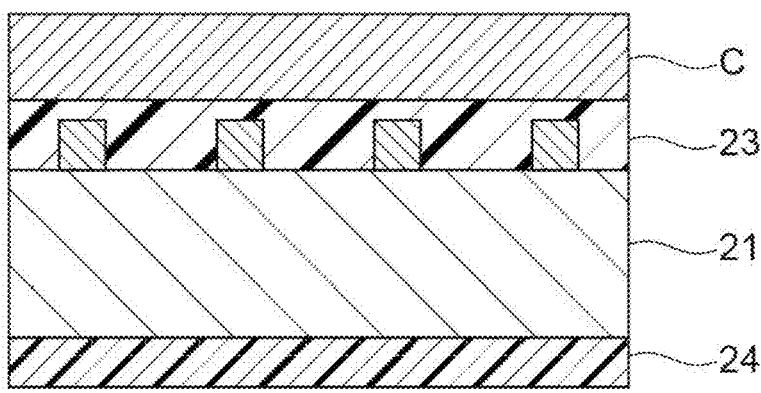

Subsequently, when the preparation of the semiconductor die 20 having the above-described configuration is completed, as illustrated in FIG. 6 (a) and (b), the entire surface 23a of the resin layer 23 of the semiconductor die 20 is vacuum-suctioned and picked up by the collet C. The collet C is formed of, for example, an elastic member such as rubber. Then, the semiconductor die 20 is moved to a predetermined position on the wiring layer 12 by the collet C suctioning under vacuum, and is attached and fixed to the predetermined position of the wiring layer 12 by the adhesive member 24. At the time of this attachment, the terminal electrode 22 of the semiconductor die 20 is covered with the resin layer 23, and thus the entire surface 23a of the resin layer 23 can be pressed by the collet C to be fixed. As a result, a state illustrated in FIG. 2 (b) is obtained. Note that the semiconductor die 20 is disposed in a face-up state in which the terminal electrodes 22 face upward.

Subsequently, as illustrated in FIG. 2 (c), when the semiconductor die 20 is mounted (attached) on the wiring layer 12, the semiconductor die 20 and the connection electrodes 13 are encapsulated with an encapsulant, and the encapsulant layer 14 is formed on the wiring layer 12. The encapsulant layer 14 is formed to contain a thermosetting resin such as an epoxy resin, for example, and is cured by heat or the like after encapsulating is performed. The adhesive member 24 of the semiconductor die 20 may be cured by the thermal curing. The encapsulant constituting the encapsulant layer 14 contains a thermosetting resin composition, and contains, for example, an epoxy resin and a curing agent. The encapsulant constituting the encapsulant layer 14 may further contain inorganic fillers, for example, contains silica fillers. An average particle diameter of the inorganic fillers contained in the encapsulant may be, for example, 50 µm or less, 25 µm or less, 10 µm or less, or 0.01 µm or less. The encapsulant constituting the encapsulant layer 14 preferably contains inorganic fillers each having a large particle diameter, and preferably contains inorganic fillers each having an average particle diameter larger than the average particle diameter of the inorganic fillers contained in the resin layer 23 of the semiconductor die 20, in order to prevent warpage in manufacturing or after manufacturing the semiconductor device 1. In a case where the terminal electrodes 22 of the semiconductor die 20 are not covered with the resin layer 23, a space between the terminal electrodes 22 is encapsulated with the encapsulant layer 14, and inorganic fillers each having a particle diameter smaller than the space between the terminal electrodes 22 is used. In this case, for example, an encapsulating resin tends to have low elasticity, and grinding in a subsequent grinding step may be difficult, or warpage may occur in manufacturing or after manufacturing the semiconductor device 1. However, in a case where the terminal electrode 22 of the semiconductor die 20 is covered with the resin layer 23 as in the present embodiment, it is not necessary to consider the filling property between the terminal electrodes 22 in the material selection of the encapsulant constituting the encapsulant layer 14, and it is possible to design a flexible resin and fillers in consideration of warpage and the like.

Subsequently, when the encapsulant layer 14 is formed, as shown in FIG. 2 (d), the encapsulant layer 14 is polished by CMP or the like. As a result, the tips 13a of the connection electrodes 13 are exposed to the outside of the encapsulant layer 14a, and the tips 22a of the terminal electrodes 22 of the semiconductor die 20 are exposed to the outside from the surface 23a of the resin layer 23. As a result, the encapsulant layer 14 is thinned to the encapsulant layer 14a illustrated in FIG. 2 (d). The elastic modulus (Young's modulus) of such encapsulant layers 14 and 14a may be, for example, 3.0 GPa or more. The linear expansion coefficient of the encapsulant layers 14 and 14a may be 5 ppm/K to 150 ppm/K, and a difference from the linear expansion coefficient of the resin layer 23 may be 150 ppm/K or less, and is preferably 100 ppm/K or less. The thickness of the polished resin layer 23 may be 20 µm or more. In a case where the resin layer 23 is polished as described above, tip portions of the terminal electrodes 22 may also be polished in the same manner.

Figure 3:
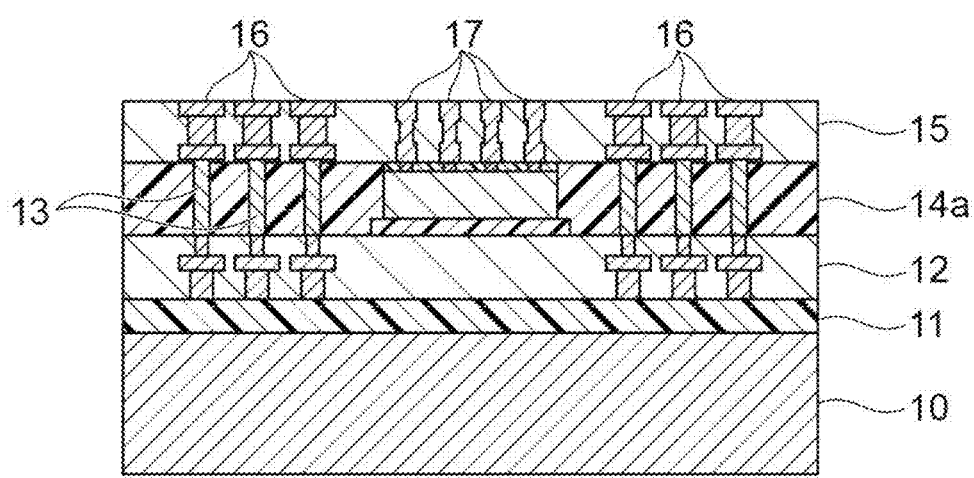
FIG. 3 (a) and (b) is a cross-sectional view illustrating a method for manufacturing the semiconductor device illustrated in FIG. 1, and illustrate steps performed after the steps illustrated in FIG. 2.
Figure 3:
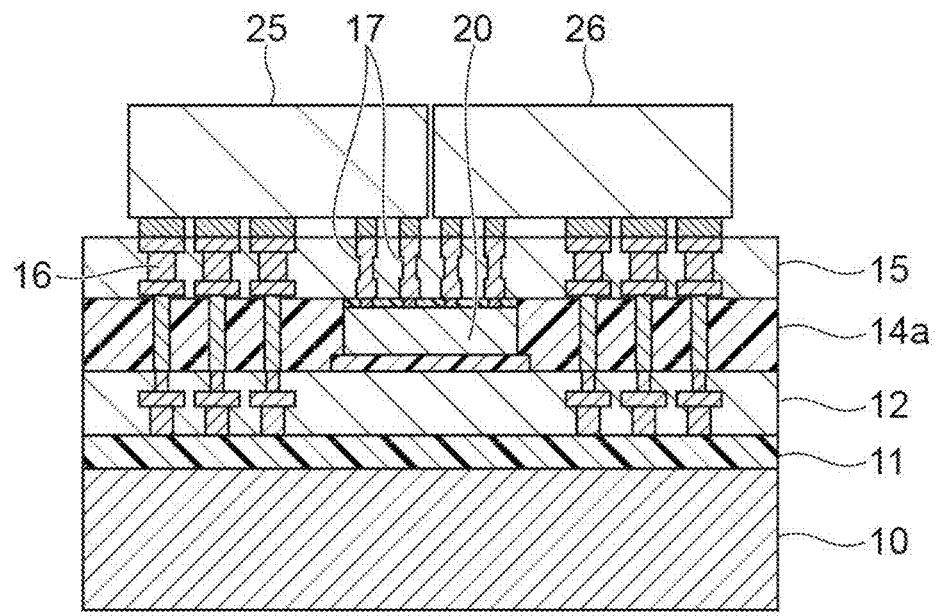

Subsequently, when the encapsulant layer 14a is formed, as illustrated in FIG. 3 (*a*), the wiring layer 15 is formed on the encapsulant layer 14a. The wiring layer 15 may be, for example, a redistribution layer (RDL). A plurality of connection electrodes 16 and a plurality of connection electrodes 17 are formed in the wiring layer 15. A portion other than the electrodes of the wiring layer 15 is an insulating portion. The connection electrodes 16 connect an external device and semiconductor dies 25 and 26 to be described later, and are connected to, for example, the connection electrodes 13. The connection electrodes 17 connect the semiconductor die 20 to the semiconductor dies 25 and 26 described later. The connection electrodes 17 are connected to the terminal electrodes 22 of the semiconductor die 20. Each connection electrode 16 and each connection electrode 17 include, for example, a copper pillar. A known method can be used as a method for manufacturing each connection electrode 16 and each connection electrode 17.

Subsequently, when the wiring layer 15 is formed, as illustrated in FIG. 3 (*b*), the semiconductor dies 25 and 26 are mounted on the wiring layer 15. The semiconductor dies 25 and 26 are, for example, semiconductor chips such as an LSI chip, a CMOS sensor, and a memory. In this mounting, the connection electrodes 16 are connected to the semiconductor dies 25 and 26, and the connection electrodes 17 connect the semiconductor die 20 to the semiconductor dies 25 and 26.

Figure 4:
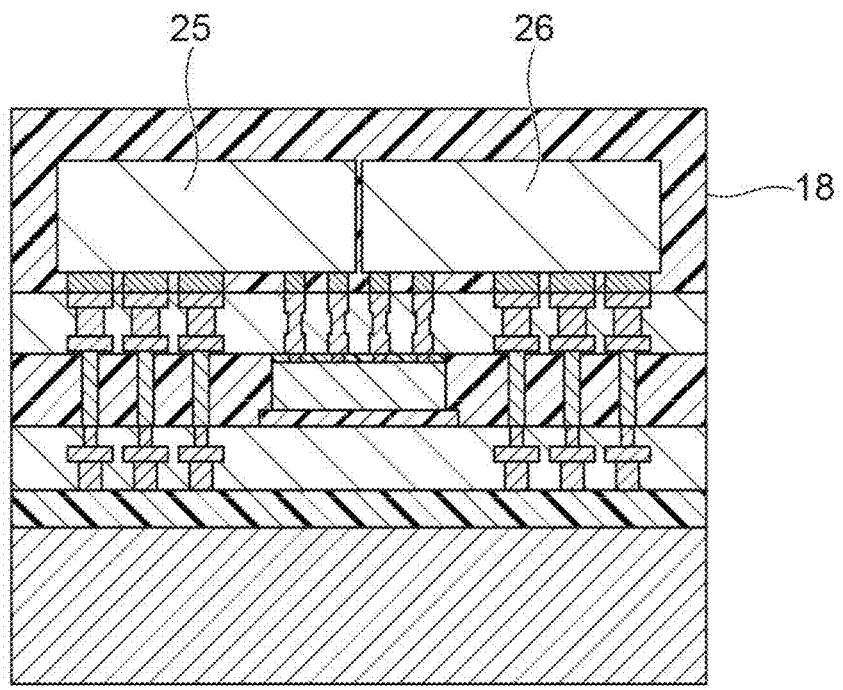
FIG. 4 (a) and (b) is a cross-sectional view illustrating the method for manufacturing the semiconductor device illustrated in FIG. 1, and illustrate steps performed after the steps illustrated in FIG. 3.
Figure 4:
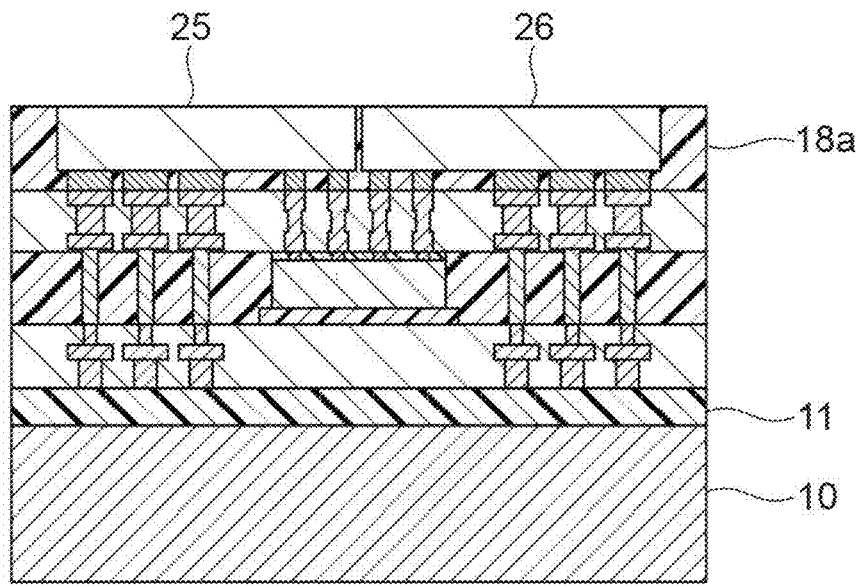

Subsequently, when the semiconductor dies 25 and 26 are mounted, as illustrated in FIG. 4 (*a*), the semiconductor dies 25 and 26 are encapsulated with an encapsulant on the wiring layer 15, and an encapsulant layer 18 is formed on the wiring layer 15. Similarly to the encapsulant layer 14, the encapsulant layer 18 contains a thermosetting resin such as an epoxy resin, for example, and is cured after encapsulating is performed.

Subsequently, when the semiconductor dies 25 and 26 are encapsulated with the encapsulant to form the encapsulant layer 18, as illustrated in FIG. 4 (*b*), grinding may be performed until the surfaces of the semiconductor dies 25 and 26 are exposed from the surface of the encapsulant layer. As a result, the encapsulant layer 18 is thinned to the encapsulant layer 18a illustrated in FIG. 4 (*b*).

Figure 5:
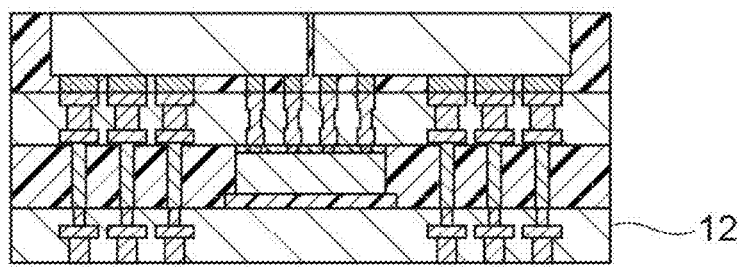
FIG. 5 (a) to (c) is a cross-sectional view showing the method for manufacturing the semiconductor device shown in FIG. 1, and show steps performed after the steps shown in FIG. 4.
Figure 5:
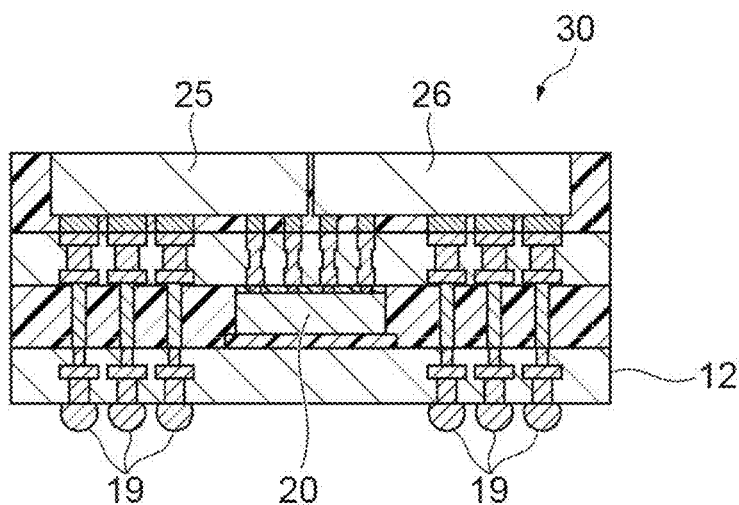
Figure 5:
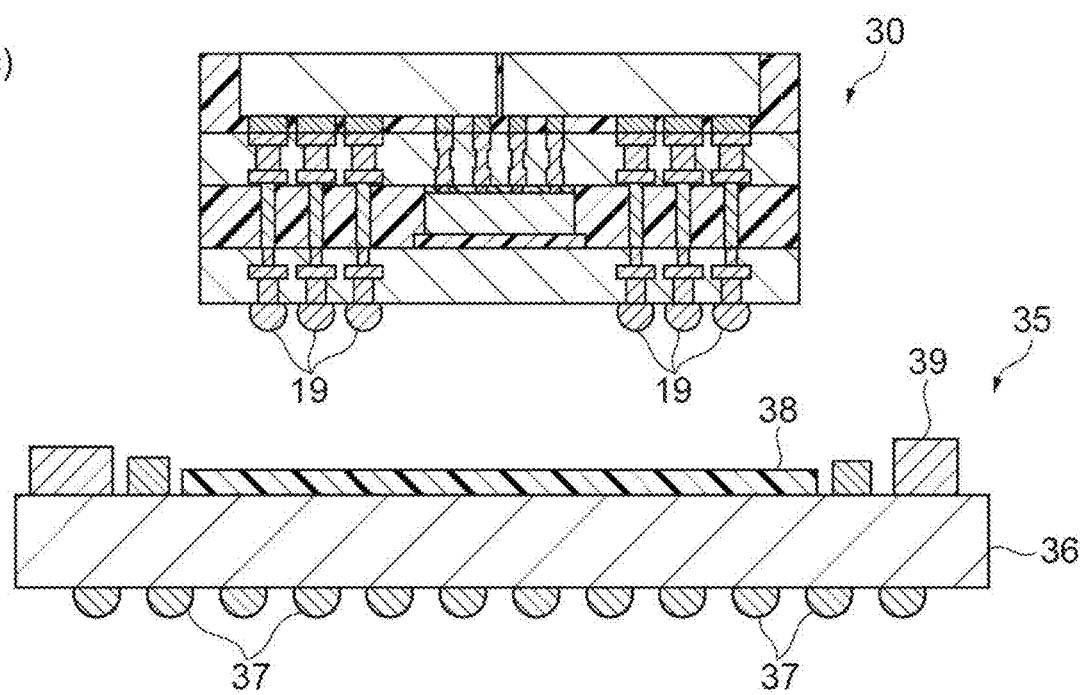

Subsequently, when the encapsulant layer 18a is formed, as illustrated in FIG. 5 (*a*), laser light irradiation or heat treatment is performed on the temporary fixing layer 11 to lower the adhesiveness of the temporary fixing layer 11 and separate the carrier substrate 10 from the wiring layer 12.

Subsequently, when the carrier substrate 10 is separated, as illustrated in FIG. 5 (*b*), the connection bumps 19 are formed at the lower ends of the connection electrodes 13 exposed from the lower surface of the wiring layer 12. A substrate 35 illustrated in FIG. 5 (*c*) is prepared. The substrate 35 is provided with a substrate body 36, connection bumps 37 for connecting wiring electrodes in the substrate body 36 to the outside, an adhesive member 38, and other members 39 (for example, various electronic components).

Subsequently, as illustrated in FIG. 5 (*c*), a semiconductor device 30 provided with the connection bumps 19 is mounted on the substrate 35. At this time, the semiconductor device 30 is bonded and fixed by the adhesive member 38 on the substrate 35. Thereafter, the adhesive member 38 is cured by thermal curing or the like, thereby manufacturing the semiconductor device 1 illustrated in FIG. 1.

Next, an example of a method for manufacturing the semiconductor die 20 used when the above-described semiconductor device 1 is manufactured will be described with reference to FIG. 7.

Figure 7:
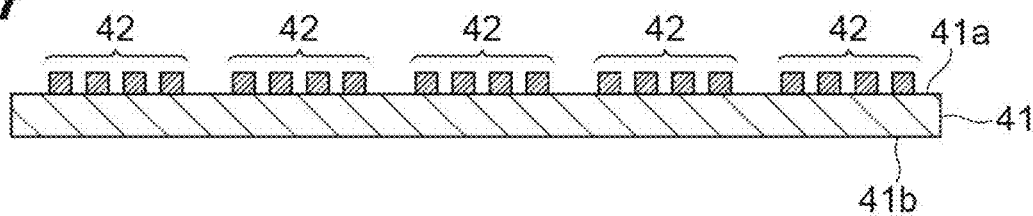
FIG. 7 (*a*) to (*e*) is a cross-sectional view illustrating a method of collectively manufacturing a plurality of bridge dies using a semiconductor wafer.
Figure 7:
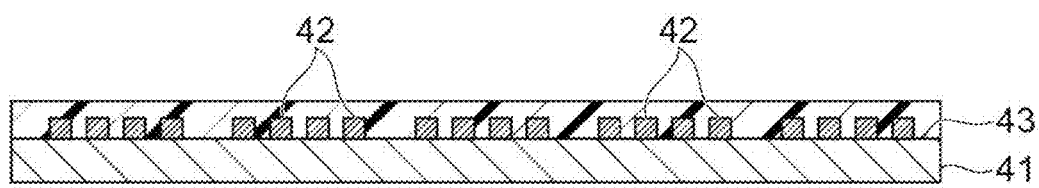
Figure 7:
Figure 7:
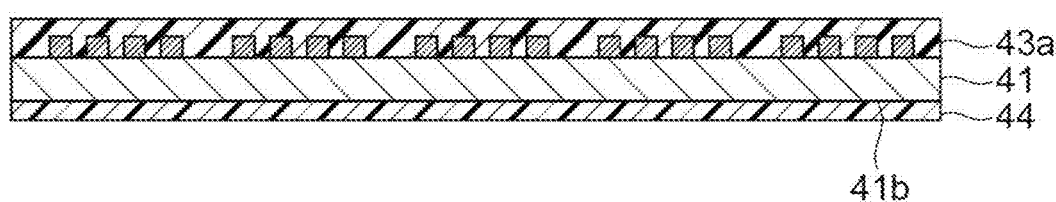
Figure 7:
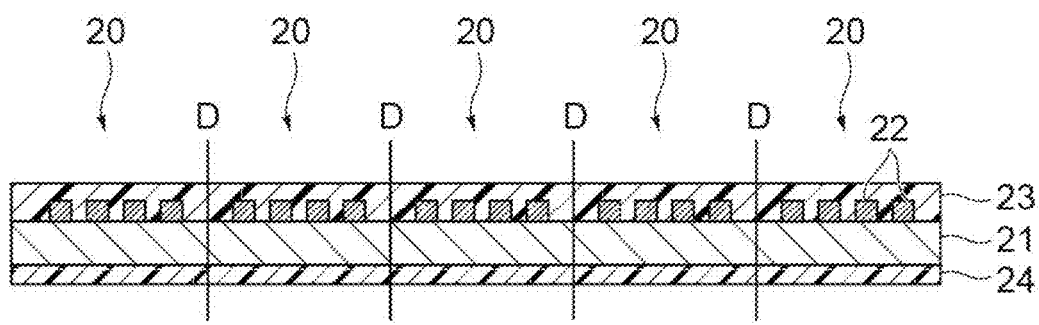

First, as illustrated in FIG. 7 (*a*), a semiconductor wafer 41 corresponding to each semiconductor substrate 21 of the plurality of semiconductor dies 20 is prepared. The semiconductor wafer 41 has a plurality of electrodes 42 corresponding to the respective semiconductor dies 20. When the semiconductor wafer 41 is prepared, as shown in FIG. 7 (*b*), a wafer resin layer 43 containing a curable resin composition is formed on an upper surface 41a (a first surface) of the semiconductor wafer 41 so as to cover the plurality of electrodes 42. The wafer resin layer 43 corresponds to the resin layer 23 (before curing) described above, and is formed by bonding a resin film containing a similar thermosetting resin composition to the semiconductor wafer 41. Note that a liquid adhesive containing the same thermosetting resin composition may be applied to the semiconductor wafer 41 to form the wafer resin layer. Thereafter, as illustrated in FIG. 7 (*c*), the wafer resin layer 43 is cured by heat or the like to form a cured wafer resin layer 43a.

Subsequently, as illustrated in FIG. 7 (*d*), a DAF corresponding to the above-described adhesive member 44 is attached to a lower surface 41b (a second surface) of the semiconductor wafer 41. Then, as illustrated in FIG. 7 (*e*), the semiconductor wafer 41 including the cured wafer resin layer 43a is singulated by dicing D to obtain a plurality of semiconductor dies 20. These semiconductor dies 20 can be used to manufacture various semiconductor devices as bridge dies. The semiconductor device illustrated in FIG. 1 is an example using the semiconductor die 20, and is not limited thereto.

Figure 9:
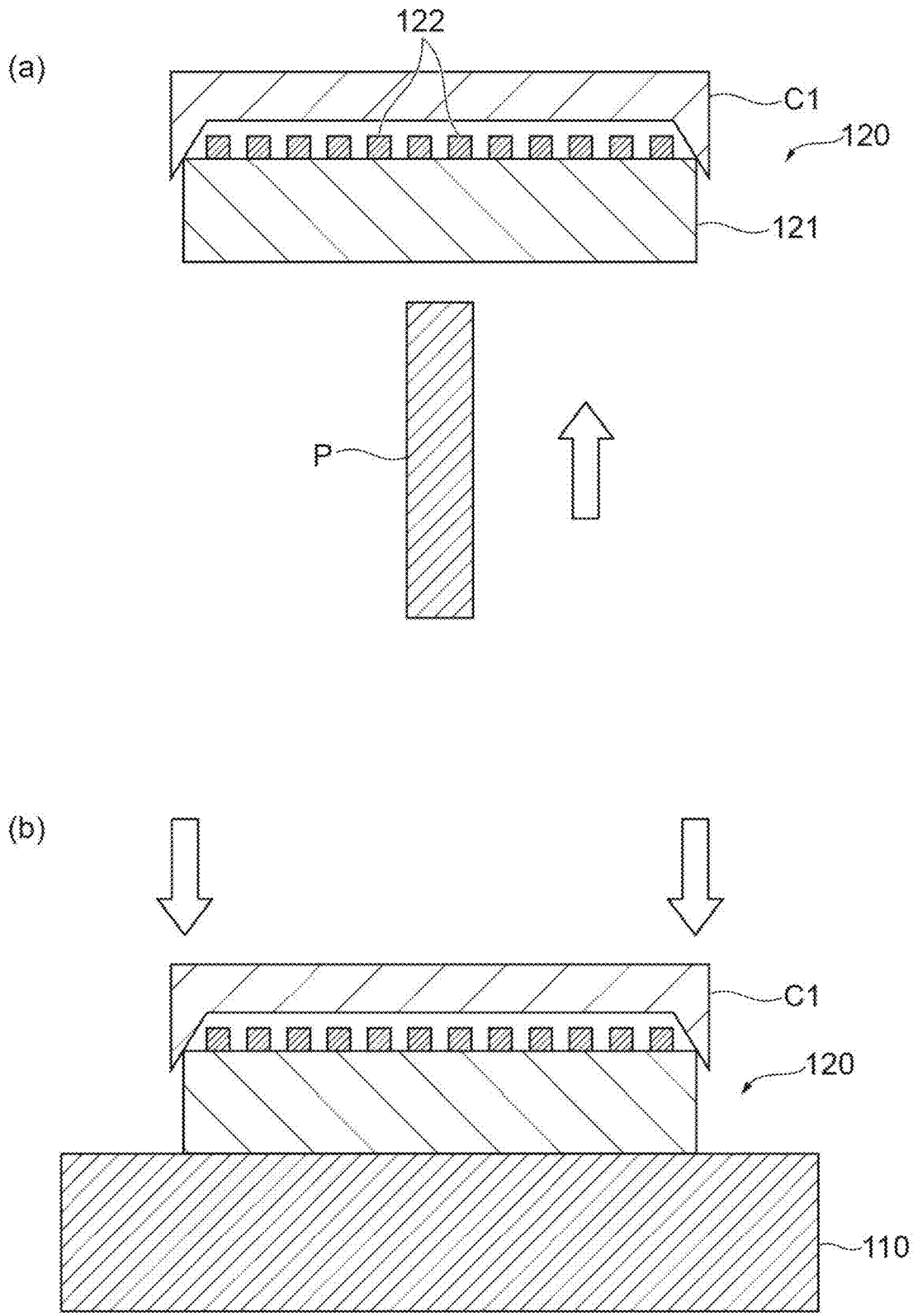
FIG. 9 (*a*) and (*b*) is a view for explaining a step of picking up and crimping a bridge die in a conventional method.

Here, operational effects in the method for manufacturing a semiconductor device according to the present embodiment, specifically, the method for mounting the semiconductor die 20 will be described in comparison with a method illustrated in FIG. 9. In the method illustrated in FIG. 9, since the resin layer 23 is not provided as in the method according to the present embodiment, a plurality of terminal electrodes 122 (copper pillars) on the semiconductor substrate 121 are exposed. Therefore, as illustrated in FIG. 9 (*a*), the suction is performed using a collet C1 whose outer periphery protrudes (center is recessed) so as to avoid terminal electrodes 122. Since thinning of the semiconductor die has progressed, when such suction is performed, the outer periphery of the semiconductor die 120 is strongly suctioned, and the semiconductor die 120 may be warped. In particular, in a case where a plurality of semiconductor dies 120 are obtained by singulating a semiconductor wafer, the semiconductor die 120 is pushed up with a pin P or the like from the back side when being separated from a dicing tape, and this may promote warping of the semiconductor die 120, or may cause the semiconductor die 120 to be cracked in some cases. As illustrated in FIG. 9 (*b*), when perform mounting on a support 110 and crimping after suction, since a load is applied only to the outer peripheral portion (see the illustrated two arrows), the load is hardly applied to the central portion of the back surface of the semiconductor die 120, and the crimping may not be sufficient or a gap may be formed in the central portion.

Meanwhile, in the method for manufacturing a semiconductor device according to the present embodiment, as illustrated in FIG. 6, when the semiconductor die 20 is mounted, the cured resin layer 23 is provided on the upper surface 21a of the semiconductor substrate 21 so as to cover the plurality of terminal electrodes 22. Then, the surface 23a of the cured resin layer 23 is suctioned and picked up by the collet C to perform the subsequent attachment. As described above, the plurality of terminal electrodes 22 are covered with the resin layer 23, and the semiconductor die 20 is suctioned and picked up by the collet C as the holding member without avoiding the terminal electrodes 22, so that the semiconductor die can be prevented from being warped or broken. In addition, since the plurality of terminal electrodes 22 are covered with the resin layer 23, when the semiconductor die 20 is attached to a support such as the wiring layer 12, a load can be applied to the entire semiconductor die 20 in the planar direction, and the semiconductor die 20 can be reliably attached to the support. As described above, according to this method for manufacturing a semiconductor device, it is possible to reliably attach the semiconductor die 20. Further, in this method for manufacturing a semiconductor device, since a portion covering the terminal electrodes 22 is formed of the cured resin layer 23, the manufacturing is easy.

In the method for manufacturing a semiconductor device according to the present embodiment, when the semiconductor die 20 is prepared, a resin layer containing a curable resin composition is formed on the upper surface 21a of the semiconductor substrate 21 so as to cover the plurality of terminal electrodes 22, and this resin layer is cured to form a cured resin layer. Thus, the resin layer 23 for protecting the plurality of terminal electrodes 22 can be easily formed.

In the method for manufacturing a semiconductor device according to the present embodiment, the cured resin layer 23 is formed by bonding a resin film (for example, a DAF) containing a curable resin composition to the upper surface 21a of the semiconductor substrate 21 and then curing the resin film. Thus, the resin layer 23 for protecting the plurality of terminal electrodes 22 can be easily formed. Also, the cured resin layer 23 may be formed by applying a liquid adhesive containing a curable resin composition to the upper surface 21a of the semiconductor substrate 21 and then curing the liquid adhesive. Also in this case, the resin layer 23 for protecting the plurality of terminal electrodes 22 can be easily formed.

In the method for manufacturing a semiconductor device according to the present embodiment, the cured resin layer 23 preferably contains an inorganic filler. In this case, the hardness (such as elastic modulus) of the resin layer 23 can be improved, and warping and cracking of the semiconductor die 20 can be further prevented. In addition, when the inorganic filler is contained, warpage of the semiconductor die 20 including the resin layer 23 can be prevented. Furthermore, when the inorganic filler is contained, the polishing treatment is easily performed in a case where the resin layer 23 is polished.

In the method for manufacturing a semiconductor device according to the present embodiment, the content of the inorganic fillers in the cured resin layer 23 may be 10 mass % or more based on the total solid content contained in the resin layer before curing. In this case, the warpage of the semiconductor die 20 can be more reliably prevented.

In the method for manufacturing a semiconductor device according to the present embodiment, an average particle diameter of the inorganic fillers in the cured resin layer 23 is preferably 20 μm or less. In this case, even when each terminal electrode 22 of the semiconductor die 20 and a pitch thereof are miniaturized, the resin and a filler can be reliably made to enter between the respective terminal electrodes, and the terminal electrodes can be reliably covered with the resin layer.

In the method for manufacturing a semiconductor device according to the present embodiment, the elastic modulus of the cured resin layer 23 may be 10 MPa or more. In this case, warping and cracking of the semiconductor die 20 can be further prevented. In addition, when the cured resin layer 23 is polished to expose the terminal electrodes 22, a polishing operation can be easily performed. When the cured resin layer 23 has a high elastic modulus, the resin layer, the copper pattern, and the like can be easily ground at the time of grinding.

In the method for manufacturing a semiconductor device according to the present embodiment, when the semiconductor die 20 is prepared, the semiconductor wafer 41 corresponding to the plurality of semiconductor substrates 21 is prepared, and then the wafer resin layer 43 containing the curable resin composition is formed on the upper surface 41a of the semiconductor wafer 41 so as to cover the plurality of electrodes 42. Then, the wafer resin layer 43 is cured. Thereafter, the semiconductor wafer 41 is singulated by dicing D to obtain a plurality of semiconductor dies 20. According to this method, a plurality of semiconductor dies 20 can be collectively manufactured. Further, according to this manufacturing method, even in a case of performing singulation by dicing, the semiconductor die 20 can be separated from a dicing tape without being warping or broken.

In the method for manufacturing a semiconductor device according to the present embodiment, after the semiconductor die 20 is attached to the wiring layer 12 as a support, the semiconductor die 20 may be encapsulated with an encapsulant, and the encapsulant layers 14 and 14a may be formed on the wiring layer 12. An average particle diameter of the inorganic fillers contained in the encapsulant layers 14 and 14a is preferably larger than an average particle diameter of the inorganic fillers contained in the resin layer 23. As described above, when large inorganic fillers are contained in the encapsulant, warpage of the encapsulant layer 14 due to heat can be more reliably prevented. In particular, in a large format process, suction can be reliably performed in high-precision processing in the next and subsequent steps.

In the method for manufacturing a semiconductor device according to the present embodiment, a difference between a linear expansion coefficient of the encapsulant layers 14 and 14a and a linear expansion coefficient of the cured resin layer 23 is preferably 150 ppm/K or less. In this case, the behavior of the encapsulant layer 14a and the resin layer 23 when heat is applied to the manufactured semiconductor device 1 becomes uniform, and it is possible to reduce occurrence of defects due to heat such as deviation in expansion.

In the method for manufacturing a semiconductor device according to the present embodiment, the cured resin layer 23 may be polished together with the encapsulant layer 14a so that the tip 22a of each of the plurality of terminal electrodes 22 is exposed from the cured resin layer 23. As a result, a fine wiring layer 15 or the like can be accurately formed on the surface of the polished encapsulant layer 14 or the like.

In the method for manufacturing a semiconductor device according to the present embodiment, the thickness of the cured resin layer 23 may be 15 μm or more or 30 μm or more when the semiconductor die 20 is picked up or attached by the collet C. In this case, warping and cracking of the semiconductor die 20 can be more reliably prevented.

In the method for manufacturing a semiconductor device according to the present embodiment, the adhesive member 24 for attaching the semiconductor die 20 to a support such as the wiring layer 12 is provided on the lower surface 21b of the semiconductor substrate 21. As a result, the semiconductor die 20 can be more reliably attached to the wiring layer 12.

In the method for manufacturing a semiconductor device according to the present embodiment, the difference between the linear expansion coefficient of the cured resin layer 23 and the linear expansion coefficient of the adhesive member 24 may be 150 ppm/K or less. In this case, since the thermal expansions of the cured resin layer and the adhesive member which sandwich the semiconductor substrate therebetween are substantially the same, it is possible to prevent a position or parallelism of the semiconductor substrate from being impaired and to prevent the warpage of the chip to be mounted.

In the method for manufacturing a semiconductor device according to the present embodiment, the thickness of the cured resin layer 23 may be between 50% and 150% or between 80% and 120% with respect to the height of the terminal electrode 22. In this case, since the thickness of the resin layer 23 is substantially equal to the height of the terminal electrode 22, the semiconductor die 3 can be picked up and attached more reliably.

In the method for manufacturing a semiconductor device according to the present embodiment, the adhesive member 44 is preferably the same member as the resin layer 23 before being cured. In this case, since the members arranged on the upper and lower sides of the semiconductor substrate 21 are the same type (for example, all members are DAF), even in a case where heat or the like is applied, the same behavior is obtained, and it is possible to reduce defects due to a difference in behavior.

In the method for manufacturing a semiconductor device according to the present embodiment, when the semiconductor die 20 is picked up by the collet C, this picking up is performed by the collet C suctioning the entire surface 23a of the cured resin layer 23, and when attaching the semiconductor die 20, this attaching is performed by the collet C applying a load to the entire surface 23a of the cured resin layer 23. Therefore, warping or cracking of the semiconductor die 20 can be more reliably prevented, and the semiconductor die 20 can also be more reliably attached to a support such as the wiring layer 12.

In the method for manufacturing a semiconductor device according to the present embodiment, an ionic impurity concentration of the cured resin layer 23 is 5 ppm or less (or 3 ppm or less). This makes it possible to prevent migration between the plurality of terminal electrodes 22 covered with the cured resin layer 23.

In the method for manufacturing a semiconductor device according to the present embodiment, the adhesive strength between the cured resin layer 23 and the upper surface 21a of the semiconductor substrate 21 is 1 MPa or more. As a result, in the manufactured semiconductor device 1, the resin layer 23 of the semiconductor die 20 is prevented from being separated.

Figure 8:
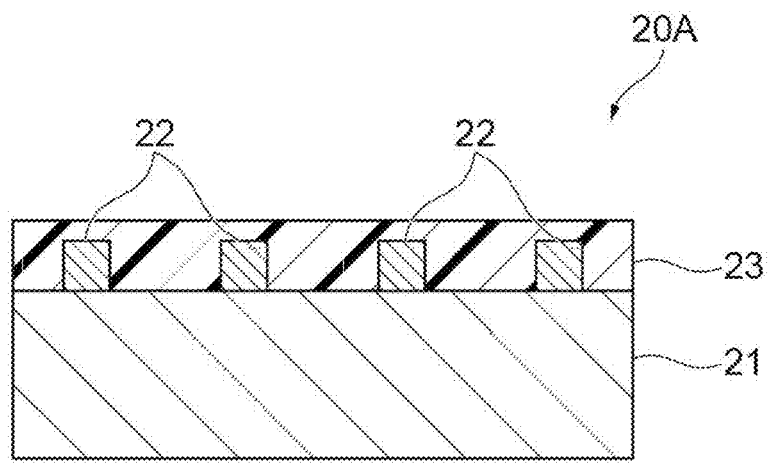
FIG. 8 is a cross-sectional view illustrating a bridge die according to a modification example.

Although the embodiments of the present disclosure have been described above, the present invention is not limited to the above-described embodiments, and modifications may be appropriately made without departing from the gist thereof. For example, in the above-described embodiment, the semiconductor die 20 to be used includes the adhesive member 24 as illustrated in FIG. 6, but the present invention is not limited thereto. For example, as illustrated in FIG. 8, a semiconductor die 20A not including the adhesive member 24 may be used. In this case, when the semiconductor die 20A is mounted on the wiring layer 12, solder may be provided on the wiring layer 12, a metal layer may be provided on the back surface of the semiconductor die 20, and these may be bonded. In addition, the semiconductor die 20A may be attached to the wiring layer 12 using a silver paste. Furthermore, in the above-described embodiment, the example in which the semiconductor die 20 is attached to the wiring layer 12 has been described, but the present invention is not limited thereto. For example, the semiconductor dies 20 and 20A may be directly attached onto the temporary fixing layer 11 without providing the wiring layer 12. In this case, if the temporary fixing layer 11 has adhesiveness, the semiconductor die 20A may be attached as it is, or if the temporary fixing layer does not have adhesiveness, the semiconductor die 20 may be attached.

REFERENCE SIGNS LIST

1 Semiconductor device
3 Semiconductor die (semiconductor member)
3a Semiconductor substrate
3b Terminal electrode
3c Resin layer
5a Wiring layer (support)
12 Wiring layer (support)
14, 14a Encapsulant layer
20, 20A Semiconductor die (semiconductor member)
21 Semiconductor substrate
21a Upper surface (first surface)
21b Lower surface (second surface)
22 Terminal electrode
22a Tip
23 Resin layer
24 Adhesive member
41 Semiconductor wafer
41a Upper surface (first surface)
41b Lower surface (second surface)
42 Electrode
43, 43a Wafer resin layer
44 Adhesive member

The invention claimed is:

1. A method for manufacturing a semiconductor device, comprising:
preparing a semiconductor member including a semiconductor substrate having a first surface and a second surface on an opposite side, a plurality of terminal electrodes provided on the first surface of the semiconductor substrate, and a cured resin layer provided on the first surface so as to cover the plurality of terminal electrodes;
picking up the semiconductor member by suctioning a surface of the cured resin layer of the semiconductor member with a holding member;
attaching the semiconductor member to a support; and
mounting a first semiconductor die and a second semiconductor die on a side of the first surface of the semiconductor member after attaching the semiconductor member to the support, wherein, in the mounting, the first semiconductor die and the second semiconductor die are connected by the semiconductor member.

2. The method for manufacturing a semiconductor device according to claim 1,
wherein the preparing the semiconductor member includes:

forming a resin layer containing a curable resin composition on the first surface of the semiconductor substrate so as to cover the plurality of terminal electrodes; and curing the resin layer to obtain the cured resin layer.

3. The method for manufacturing a semiconductor device according to claim 1,
wherein the cured resin layer is formed by bonding a resin film containing a curable resin composition to the first surface of the semiconductor substrate and then curing the resin film.

4. The method for manufacturing a semiconductor device according to claim 1,
wherein the cured resin layer is formed by applying a liquid adhesive containing a curable resin composition to the first surface of the semiconductor substrate and then curing the liquid adhesive.

5. The method for manufacturing a semiconductor device according to claim 1,
wherein the cured resin layer contains an inorganic filler.

6. The method for manufacturing a semiconductor device according to claim 1,
wherein an elastic modulus of the cured resin layer at room temperature is 10 MPa or more.

7. The method for manufacturing a semiconductor device according to claim 1,
wherein the preparing the semiconductor member includes:
preparing a semiconductor wafer including the semiconductor substrate, wherein a plurality of electrodes including the plurality of terminal electrodes are provided on a first surface of the semiconductor wafer;
forming a wafer resin layer containing a curable resin composition on the first surface of the semiconductor wafer so as to cover the plurality of electrodes;
curing the wafer resin layer; and
singulating the semiconductor wafer by dicing to acquire the semiconductor member.

8. The method for manufacturing a semiconductor device according to claim 1,
wherein a thickness of the cured resin layer is 30 μm or more in at least one of the picking up and the attaching.

9. The method for manufacturing a semiconductor device according to claim 1,
wherein an adhesive member configured to attach the semiconductor member to the support is provided on the second surface of the semiconductor substrate.

10. The method for manufacturing a semiconductor device according to claim 9,
wherein the adhesive member is provided on the second surface of the semiconductor substrate before the attaching the semiconductor member to the support.

11. The method for manufacturing a semiconductor device according to claim 9,
wherein a difference between a linear expansion coefficient of the cured resin layer and a linear expansion coefficient of the adhesive member is 150 ppm/K or less.

12. The method for manufacturing a semiconductor device according to claim 9,
wherein the adhesive member is the same member as the resin layer before being cured.

13. The method for manufacturing a semiconductor device according to claim 1,
wherein a thickness of the cured resin layer is between 50% and 150% with respect to a height of the plurality of terminal electrodes.

14. The method for manufacturing a semiconductor device according to claim 1,
wherein, in the picking up, the semiconductor member is picked up by the holding member suctioning the entire surface of the cured resin layer, and
wherein, in the attaching, the semiconductor member is attached by the holding member applying a load to the entire surface of the cured resin layer.

15. The method for manufacturing a semiconductor device according to claim 1:
wherein an ionic impurity concentration of the cured resin layer is 5 ppm or less.

16. The method for manufacturing a semiconductor device according to claim 1,
wherein an adhesive strength between the cured resin layer and the first surface of the semiconductor substrate is 1 MPa or more.

17. A method for manufacturing a semiconductor device comprising:
preparing a semiconductor member including a semiconductor substrate having a first surface and a second surface on an opposite side, a plurality of terminal electrodes provided on the first surface of the semiconductor substrate, and a cured resin layer provided on the first surface so as to cover the plurality of terminal electrodes;
picking up the semiconductor member by suctioning a surface of the cured resin layer of the semiconductor member with a holding member;
attaching the semiconductor member to a support; and
forming an encapsulant layer on the support by encapsulating the semiconductor member with an encapsulant after the semiconductor member is attached to the support,
polishing the cured resin layer together with the encapsulant layer so that a tip of each of the plurality of terminal electrodes is exposed from the cured resin layer.

18. The method for manufacturing a semiconductor device according to claim 17,
wherein an average particle diameter of inorganic fillers contained in the encapsulant layer is larger than an average particle diameter of inorganic fillers contained in the cured resin layer.

19. The method for manufacturing a semiconductor device according to claim 17,
wherein a difference between a linear expansion coefficient of the encapsulant layer and a linear expansion coefficient of the cured resin layer is 150 ppm/K or less.

* * * * *